(12) United States Patent
Murayama

(10) Patent No.: US 9,179,568 B2
(45) Date of Patent: Nov. 3, 2015

(54) ELECTRONIC DEVICE

(71) Applicant: SHINKO ELECTRIC INDUSTRIES CO., LTD., Nagano-shi, Nagano (JP)

(72) Inventor: Kei Murayama, Nagano (JP)

(73) Assignee: SHINKO ELECTRIC INDUSTRIES CO., LTD., Nagano-shi, Nagano (JP)

(*) Notice: Subject to any disclaimer, the term of this patent is extended or adjusted under 35 U.S.C. 154(b) by 206 days.

(21) Appl. No.: 13/914,660

(22) Filed: Jun. 11, 2013

(65) Prior Publication Data

US 2013/0329385 A1 Dec. 12, 2013

(30) Foreign Application Priority Data

Jun. 12, 2012 (JP) .................................. 2012-133235

(51) Int. Cl.
*H05K 1/00* (2006.01)
*H05K 7/02* (2006.01)
*H05K 5/00* (2006.01)
*H01L 23/10* (2006.01)

(52) U.S. Cl.
CPC *H05K 7/02* (2013.01); *H01L 23/10* (2013.01); *H05K 5/0091* (2013.01); *H01L 2224/48091* (2013.01); *H01L 2224/48227* (2013.01); *H01L 2224/49175* (2013.01); *H01L 2924/1461* (2013.01)

(58) Field of Classification Search
CPC ........... H01L 2224/48091; H01L 2924/00014; H01L 2224/48227; H01L 2224/49175; H01L 23/10; H01L 2924/1461; H05K 5/0091; H05K 7/02

USPC .......... 361/751, 757, 783, 752; 257/704, 698, 257/690

See application file for complete search history.

(56) References Cited

U.S. PATENT DOCUMENTS

| 3,434,019 | A | * | 3/1969 | Carley | 257/579 |
| 2004/0207071 | A1 | * | 10/2004 | Shiomi et al. | 257/704 |
| 2008/0061424 | A1 | * | 3/2008 | Murayama et al. | 257/690 |
| 2011/0156242 | A1 | * | 6/2011 | Sakaguchi et al. | 257/698 |

FOREIGN PATENT DOCUMENTS

| JP | 2007017199 | * | 1/2007 |
| JP | 2012-39022 A | | 2/2012 |

* cited by examiner

*Primary Examiner* — Yuriy Semenenko
(74) *Attorney, Agent, or Firm* — Drinker Biddle & Reath LLP

(57) ABSTRACT

An electronic device includes: a housing having a concave portion in the first surface of the housing; a lid made of a semiconductor material containing an impurity material; a first metal film formed in a metal film formation region on the first surface of the housing, wherein the metal film formation region is defined as a region surrounding the concave portion on the first surface of the housing; a second metal film formed on the first surface of the lid to overlap with the metal film formation region in a top view of the electronic device; a third metal film formed on the second surface of the lid to overlap with the metal film formation region in the top view; and an electronic component disposed in the concave portion. The lid is bonded onto the housing via the first and second metal films to cover the electronic component.

8 Claims, 9 Drawing Sheets

FIG. 1A
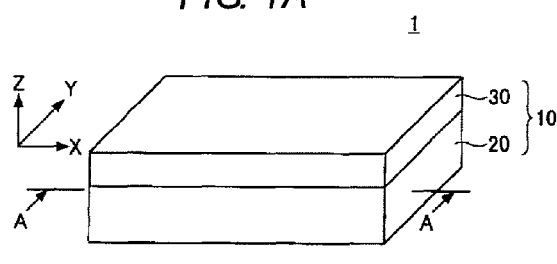
FIG. 1B
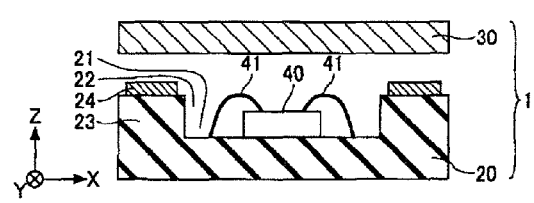
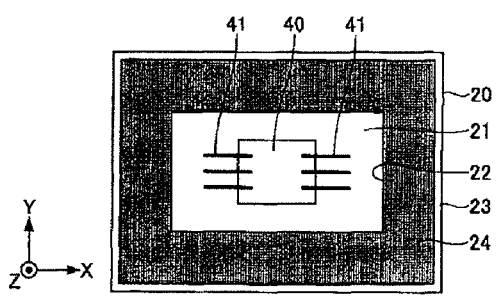
FIG. 1C

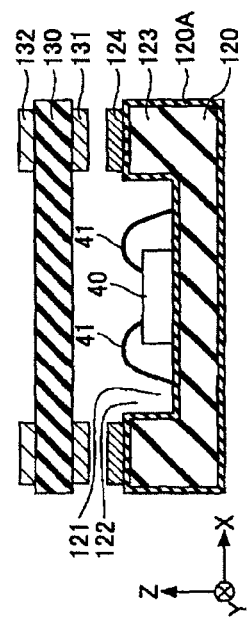
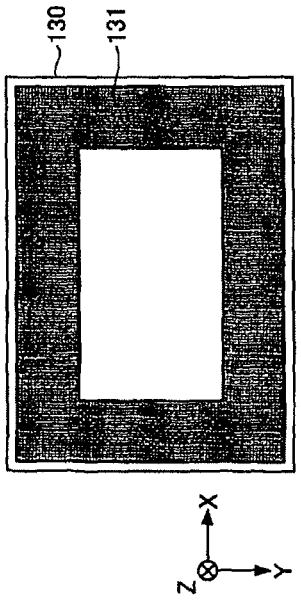
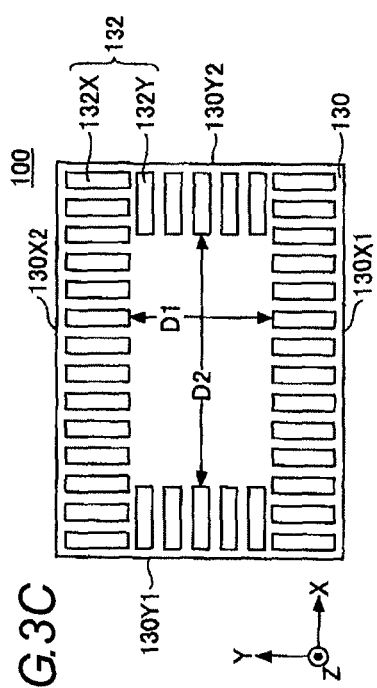
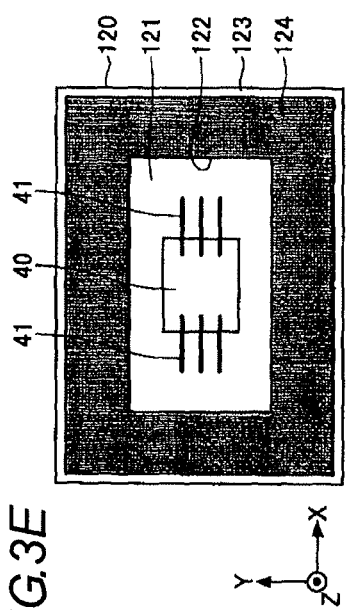
FIG.3A  FIG.3B  FIG.3C  FIG.3D  FIG.3E

FIG.7

| MATERIAL | | SPECIFIC RESISTANCE (Ω×cm) | CURRENT DENSITY (A/m²) | LOSS (W/m³) |
|---|---|---|---|---|
| KOVAR | LID | 4.9*E-5 | 5.2*E10 | 2.4*E14 |
| | PLATING LAYER 131 | 1*E-4 | 2.3*E10 | 1.5*E14 |
| SILICON | LID | 0.01 | 1.1*E11 | 7.8*E14 |
| | PLATING LAYER 131 | 1*E-4 | 3.9*E10 | 5.2*E14 |
| ALUMINA | LID | 1*E10 | - | - |
| | PLATING LAYER 131 | 1*E-4 | - | - |

ELECTRONIC DEVICE

This application claims priority from Japanese Patent Application No. 2012-133235, filed on Jun. 12, 2012, the entire contents of which are herein incorporated by reference.

BACKGROUND

1. Technical Field

The present disclosure relates to an electronic device.

2. Related Art

In the related art, there is a semiconductor package which includes a base substrate in which a cavity having an opening portion on an upper surface is provided and an electronic component which is mounted into the cavity, wherein a lid is welded to an upper surface of the base substrate so as to seal the cavity. In the semiconductor package, each of convex portions having the same height is formed in a rectangular frame shape and formed on the upper surface of the lid to face the peripheral wall portions of the cavities formed in the base substrate (see e.g., JP-A-2012-039022).

However, since the lid which is welded to the base substrate of the related-art semiconductor package is formed of a metal such as Kovar, current or heat is diffused at the time of welding, and power required for the welding is increased.

In the related art, since the power required for the welding is increased, there is a problem that a hollow housing in which the lid is welded to the base substrate cannot be effectively manufactured.

SUMMARY OF THE INVENTION

According to one or more aspects of the present embodiment, there is provided an electronic device comprising: a housing comprising a first surface and a second surface opposite to the first surface, wherein a concave portion is formed in the first surface of the housing; a lid made of a semiconductor material containing an impurity material and comprising a first surface and a second surface opposite to the first surface, wherein the first surface of the lid faces the first surface of the housing; a first metal film formed in a metal film formation region on the first surface of the housing, wherein the metal film formation region is defined as a region surrounding the concave portion on the first surface of the housing; a second metal film formed on the first surface of the lid to overlap with the metal film formation region in a top view of the electronic device; a third metal film formed on the second surface of the lid to overlap with the metal film formation region in the top view; and an electronic component disposed in the concave portion, wherein the lid is bonded onto the housing via the first and second metal films to cover the electronic component disposed in the concave portion.

BRIEF DESCRIPTION OF THE DRAWINGS

FIGS. 1A to 1C are views showing a hollow housing and an electronic device of a Comparative Example;

FIGS. 3A to 3E are views showing a hollow housing and an electronic device of an embodiment of the present invention;

FIG. 7 is a view showing specific resistance, current density, and loss of the lid 30 of the Comparative Example, the lid 130 of the embodiment, and a lid 30A of a modification of the Comparative Example;

DETAILED DESCRIPTION

Figure 2A:
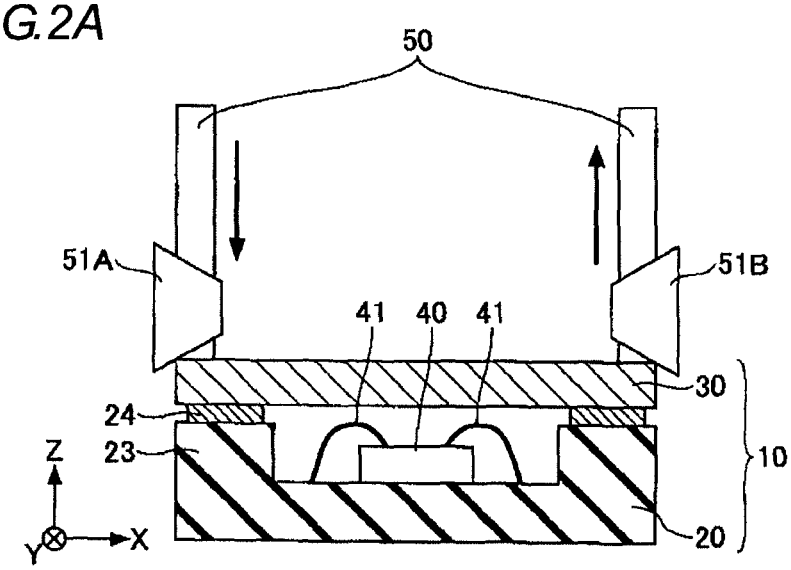
FIGS. 2A and 2B are views showing a process of mounting a lid 30 onto a housing 20 in a manufacturing process of an electronic device 1 of the Comparative Example.

Hereinafter, an electronic device of the present embodiment will be now described with reference to the drawings. First, a hollow housing of a Comparative Example will be now described with reference to FIGS. 1A to 2B.

Comparative Example

FIGS. 1A to 1C are views showing the hollow housing and the electronic device of a Comparative Example, FIG. 1A is a perspective view thereof, FIG. 1B is an exploded cross-sectional view in a cross-section taken along a line A-A, and FIG. 1C is a plan view of a housing.

An electronic device 1 of the Comparative Example shown in FIGS. 1A and 1B includes a Micro Electronic Mechanical System (MEMS) chip 40 provided in a hollow housing 10. That is, the electronic device 1 includes the hollow housing 10 and the MEMS chip 40. The hollow housing 10 is a housing in which the MEMS chip 40 is eliminated from the electronic device 1.

As shown in FIGS. 1A and 1B, the hollow housing 10 of the Comparative Example includes a housing 20 and a lid 30. FIG. 1C is a plan view showing the housing 20 in a state before the lid 30 is bonded to the housing 20.

The housing 20 is formed in a rectangular parallelepiped-shape and includes a concave portion 21 and is made by processing a ceramic substrate. The concave portion 21 is concaved in a rectangular parallelepiped shape from an upper surface side of the housing 20. As shown in FIG. 1C, the concave portion 21 is exposed to an opening portion 22 in the state before the lid 30 is bonded to the housing 20.

The MEMS chip 40 is disposed on a lower surface of the concave portion 21. The MEMS chip 40 is connected to a pad (not shown), which is disposed on the bottom surface of the concave portion 21, by a bonding wire 41. For example, the MEMS chip 40 is an actuator of an acceleration sensor.

The concave portion 21 of the housing 20 is continuously surrounded by a wall portion 23, and the opening portion 22 is a rectangular opening portion which is surrounded by the wall portion 23. Moreover, the wall portion 23 is formed in a rectangular annular shape in a plan view.

A plating layer 24 is formed on an upper surface of the wall portion 23 along the periphery of the opening portion 22. The plating layer 24 is formed on a rectangular annular shaped region of the upper surface of the wall portion 23 in a plan view. That is, the plating layer 24 is formed in a rectangular shape so as to surround the opening portion 22.

For example, the plating layer 24 is a two-layered plating layer having a nickel plating layer formed on the upper surface of the wall portion 23 and a gold plating layer formed on the nickel plating layer.

The lid 30 is a plate-shaped member made of Kovar. The size of the lid 30 in a plan view is the same as the size of the housing 20 in a plan view.

The electronic device 1 of the Comparative Example is manufactured by bonding the lid 30 to the wall portion 23 of the housing 20 via the plating layer 24 in a state where the MEMS chip 40 is mounted on the bottom surface of the concave portion 21 of the housing 20 of the hollow housing 10. In the state where the wall portion 23 of the housing 20 and the lid 30 are bonded to each other by the plating layer 24, the concave portion 21 of the housing 20 in which the MEMS chip 40 is disposed is sealed by the plating layer 24 and the lid 30.

Figure 2B:
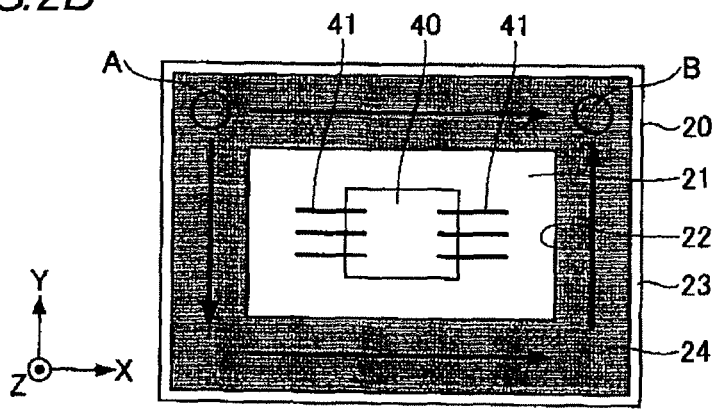

FIGS. 2A and 2B are views showing a process of mounting the lid 30 onto the housing 20 in a manufacturing process of the electronic device 1 of the Comparative Example, FIG. 2A is a cross-sectional view corresponding to FIG. 1B, and FIG. 2B is a plan view corresponding to FIG. 1C.

As shown in FIG. 2A, the plating layer 24 is melted using a welding machine 50, and the electronic device 1 is manufactured by bonding the upper surface of the wall portion 23 of the housing 20 and the lower surface of the lid 30 through the melted plating layer 24.

The welding machine 50 includes roller electrodes 51A and 51B. Current flows between the roller electrodes 51A and 51B while the roller electrodes 51A and 51B abut the lid 30 and moves along the periphery of the lid 30, and the upper surface of the wall portion 23 of the housing 20 and the lower surface of the lid 30 are seam-welded by melting the plating layer 24 with resistance heat of the lid 30.

In order to melt the housing 20 and the lid 30 by the plating layer 24, as shown in FIG. 2A, the roller electrodes 51A and 51B of the welding machine 50 abuts the upper surface of the lid 30.

If current flows from the roller electrode 51A to the roller electrode 51B as shown by an arrow, the current flows from the roller electrode 51A shown in FIG. 2A to the lid 30 made of Kovar, and reaches the plating layer 24. At this time, the current reaches a point A of the plating layer 24 shown in FIG. 2B. The point A is positioned around a corner of the plating layer 24 having a rectangular annular shape in a plan view.

Moreover, the current flows to the plating layer 24 having a rectangular annular shape in a plan view as shown by an arrow in FIG. 2B, flows to the lid 30 from the plating layer 24 in the thickness direction at a point B, and flows to the roller electrode 51B.

In this way, the current flows to the plating layer 24, and thus, the plating layer 24 is melted with resistance heat, the portion of the plating layer 24, in which the temperature is decreased according to the movement of the roller electrodes 51A and 51B, is solidified again, and the housing 20 and the lid 30 are bonded to each other.

The roller electrodes 51A and 51B move along sides of the lid 30, and thus the housing 20 and the lid 30 are bonded to each other over one round of the plating layer 24 having the rectangular annular shape. Thereby, the housing 20 and the lid 30 are bonded to each other by seam welding.

As described above, the hollow housing 10 of the Comparative Example includes the housing 20 made of ceramic and the lid 30 made of Kovar, wherein the housing 20 and the lid 30 are seam-welded via the plating layer 24.

However, in the hollow housing 10 of the Comparative Example, if the roller electrodes 51A and 51B abut the lid 30 made of Kovar and current flows at the time of the seam welding, the current flows to the entire lid 30 and thus current and heat are diffused to the entire lid 30. As such, there is a problem that usage efficiency of energy is decreased.

Moreover, in the hollow housing 10 of the Comparative Example, since the housing 20 is made of ceramic and the lid 30 is made of Kovar, miniaturization of the device is difficult. This is mainly because miniaturization of the ceramic substrate is difficult.

Accordingly, an object of the embodiment described below is to provide a hollow housing and an electronic device that can solve the above-described problems.

FIGS. 3A to 3E are views showing the hollow housing and the electronic device of the embodiment, FIG. 3A is a perspective view, FIG. 3B is an exploded cross-sectional view in a cross-section taken along a line C-C of FIG. 3A, FIG. 3C is a plan view of the hollow housing and the electronic device, FIG. 3D is a bottom view of the hollow housing, and FIG. 3E is a plan view of the housing. Here, as shown in FIGS. 3A to 3E, a rectangular coordinate system (XYZ coordinate system) is defined.

An electronic device 100 of the embodiment shown in FIGS. 3A and 3B is a device which mounts a Micro Electronic Mechanical System (MEMS) chip 40 in an inner portion of a hollow housing 110. That is, the electronic device 100 includes the hollow housing 110 and the MEMS chip 40. The hollow housing 110 is a housing in which the MEMS chip 40 is removed from the electronic device 100.

As shown in FIGS. 3A and 3B, the hollow housing 110 of the embodiment includes a housing 120 and a lid 130. Since the lid 130 is bonded onto the housing 120, the plan view of the FIG. 3C shows an upper surface of the lid 130. The upper surface of the lid 130 is the same as the surfaces of the electronic device 100 and the hollow housing 110.

FIG. 3D is a view showing a bottom surface of the lid 130 in a state before the lid 130 is bonded to the housing 120. FIG. 3E is a plan view showing the housing 120 in a state before the lid 130 is bonded to the housing 120.

The housing 120 is a rectangular parallelepiped-shaped member which includes a concave portion 121 and is formed by processing a silicon substrate. The concave portion 121 is concaved in a rectangular parallelepiped shape when viewed from an upper surface side of the housing 120, and as shown in FIG. 3E, is exposed to an opening portion 122 in the state before the lid 130 is bonded to the housing 120.

For example, as the silicon substrate which is used for forming the housing 120, a silicon substrate to which boron (B) or phosphorus (p) is implanted may be used. In addition, since the lid 130 described below is formed of a silicon substrate to which impurities are implanted, a case where the housing 120 is also formed of a silicon substrate is described. However, the housing 120 may be formed by a silicon substrate to which impurities are not implanted.

Although the details will be described below, the lid 130 is formed of a silicon substrate to which impurities are implanted since current flows to the lid 130, but the silicon substrate which forms the housing 120 may not be implanted by impurities since current does not flow to the housing 120.

The concave portion 121 of the housing 120 is continuously surrounded by a wall portion 123, and the opening portion 122 is a rectangular opening portion which is surrounded by the wall portion 123. Moreover, the wall portion 123 is formed in a rectangular annular shape in a plan view.

In the housing 120, an oxide film 120A is formed on the inner surface of the concave portion 121. The outer surface of the housing 120 includes a bottom surface of the housing 120, a side surface (the outer surface of the wall portion 123), and an upper surface of the wall portion 123. The inner surface of the concave portion 121 is a surface forming the concave portion 121, and includes one bottom surface and four side surfaces.

Thereby, the oxide film 120A is formed on the bottom surface of the housing 120, the side surfaces (outer surface of wall portion 123), the upper surface of the wall portion 123, and one bottom surface and four side surfaces which form the concave portion 121.

For example, the oxide film 120A is formed by oxidizing the surface after cutting a silicon substrate to the size of the housing 120 and forming the concave portion 121. Since the oxide film 120A formed by oxidizing the surface of the silicon substrate is a silicon oxide film ($SiO_2$ film), the oxide film is an insulating film.

A plating layer 124 is formed on an upper surface of the wall portion 123 along the periphery of the opening portion 122. The plating layer 124 is formed on the oxide film 120A.

The plating layer 124 is formed on a rectangular annular shaped region of the upper surface of the wall portion 123 in a plan view, and is an example of a first metal film. That is, the plating layer 124 is formed so as to surround the opening portion 122 and make one round in a rectangular shape.

For example, the plating layer 124 is a plating layer having a two-layer structure which includes a nickel plating layer formed on the upper surface of the wall portion 123 and a gold plating layer formed on the nickel plating layer.

The MEMS chip 40 is disposed on the bottom surface of the concave portion 121, and is connected to a pad (not shown) or the like, which is disposed on the bottom surface of the concave portion 121, by a bonding wire 41. For example, the MEMS chip 40 is an actuator of an acceleration sensor.

Moreover, a penetration electrode is formed in the housing 120, and the MEMS chip 40 and the external device are electrically connected to each other via the penetration electrode.

In addition, the MEMS chip 40 is described as an example of an electronic component. However, the electronic component which is accommodated in the hollow housing 110 of the embodiment is not limited to the MEMS chip 40. The electronic component which is accommodated in the hollow housing 110 of the embodiment may be an electronic component which is accommodated in a sealed space (encapsulated space). For example, as the electronic component, a semiconductor element such as an IC (Integrated Circuit) chip may be accommodated in the hollow housing 110.

The lid 130 is a plate-shaped member made of silicon. The size of the lid 130 in a plan view is the same as the size of the housing 120 in a plan view. For example, the lid 130 is formed by processing a silicon substrate.

For example, as the silicon substrate which is used for forming the lid 130, a silicon substrate to which boron (B) or phosphorus (p) is implanted may be used. This is because current flows to the lid 130.

A plating layer 131 is formed on the bottom surface (lower surface) of the lid 130. The plating layer 131 is formed in a rectangular annular shaped region along the outer circumference of the rectangular lid 130 in a bottom surface view. The rectangular annular shaped region on which the plating layer 131 is formed corresponds to the plating layer 124 which is formed on the rectangular annular shaped region of the upper surface of the wall portion 123 of the housing 120. That is, the plating layer 131 is formed at the position corresponding to the plating layer 124.

The plating layer 131 is an example of a second metal film. For example, the plating layer 131 is manufactured by forming a nickel plating film on the bottom surface (lower surface) of the lid 130. Since the lid 130 is a silicon substrate, for example, the formation of the plating layer 131 may be performed by a semi-additive process.

Here, in the case where the plating layer 131 is formed at the position corresponding to the plating layer 124, when transparently viewed in a plan view, the region on which the plating layer 131 is formed and the region on which the plating layer 124 is formed are not needed to completely coincide with each other, and the overlapped region only needs to exist over one round in the rectangular annular shape.

The plating layer 131 is bonded to the plating layer 124 by seam-welding. Moreover, the lid 130 is formed of a silicon substrate.

Thereby, the plating layer 131 may be formed on the bottom surface (lower surface) of the lid 130 to be bonded to the plating layer 124 over one round in the outer circumference in the XY direction of the hollow housing 110. Thus, the lid 130 seals the concave portion 121 of the housing 120.

In addition, a plating layer 132 is formed on the upper surface of the lid 130. When the plating layer 132 is transparently viewed in a plan view, the plating layer 132 is formed on a region which overlaps with the plating layer 131. That is, the plating layer 132 is formed on a rectangular annular shaped region along the outer circumference of the rectangular lid 130.

The plating layer 132 is an example of a third metal film. For example, the plating layer 132 may be formed by forming a copper coating film on the upper surface of the lid 130. Since the lid 130 is a silicon substrate, for example, the formation of the plating layer 132 may be performed by a semi-additive process. Moreover, the plating layer 132 has a higher melting point than that of the plating layer 131.

The plating layer 132 is formed at a position corresponding to the plating layer 131. In the case where the plating layer 132 is formed at the position corresponding to the plating layer 131, when transparently viewed in a plan view, the region on which the plating layer 132 is formed and the region on which the plating layer 131 is formed are not needed to completely coincide with each other, and the overlapped region only needs to exist over one round in the rectangular annular shape.

As shown in FIG. 3C, the plating layer 132 includes a plurality of metal films 132X and 132Y separated from each other in the rectangular annual shaped region along the outer circumference of the lid 130. The metal films 132X and 132Y are examples of a plurality of metal film portions which are separated from each other in a plan view and surround the center portion of the upper surface of the lid 130.

The metal films 132X are arranged along sides 130X1 and 130X2 which extend in the X axis direction in the outer circumference of the lid 130, and are a plurality of rectangular metal films having the longitudinal direction in the Y axis direction. In the plurality of metal films 132X, the lengths in the X axis direction and the Y axis direction are approximately the same as each other except for the metal films 132X of the both ends in the X axis direction. Moreover, all metal films 132X are disposed at approximately equal intervals in the X axis direction.

The metal films 132X formed along the side 130X1 and metal films 132X formed along the side 130X2 are disposed at positions symmetrical in the Y axis direction while interposing the center portion of the upper surface of the lid 130, and are disposed so as to be pairs in the Y axis direction. Here, the side 130X1 is a side which extends in the X axis direction of a Y-axis negative direction side in the rectangular lid 130 in a plan view, and the side 130X2 is a side which extends in the X axis direction in a Y-axis positive direction side.

A distance D1 in the Y axis direction between the metal films 132X formed along the side 130X1 and the metal films 132X formed along the side 130X2 is set so as to be longer than the thickness (the thickness of the silicon substrate which does not include the plating layers 131 and 132) of the lid 130. That is, the interval in the Y axis direction between the metal films 132X formed along the side 130X1 and the metal films 132X formed along the side 130X2 is larger than the thickness of the silicon substrate of the lid 130.

The metal films 132Y are arranged along sides 130Y1 and 130Y2 which extend in the Y axis direction in the outer circumference of the lid 130, and are a plurality of rectangular metal films having the longitudinal direction in the X axis direction. In the plurality of metal films 132Y, the lengths in the X axis direction and the Y axis direction are approximately the same as each other except for the metal films 132Y of the both ends in the Y axis direction. Moreover, all the metal films 132Y are disposed at approximately equal intervals in the Y axis direction.

The metal films 132Y formed along the side 130Y1 and metal films 132Y formed along the side 130Y2 are disposed at positions symmetrical in the X axis direction while interposing the center portion of the upper surface of the lid 130, and are disposed so as to be pairs in the X axis direction. Here, the side 130Y1 is a side which extends in the Y axis direction of an X-axis negative direction side in the rectangular lid 130 in a plan view, and the side 130Y2 is a side which extends in the Y axis direction in an X-axis positive direction side.

A distance D2 in the X axis direction between the metal films 132Y formed along the side 130Y1 and the metal films 132Y formed along the side 130Y2 is set so as to be longer than the thickness (the thickness of the silicon substrate which does not include the plating layers 131 and 132) of the lid 130. That is, the interval in the X axis direction between the metal films 132Y formed along the side 130Y1 and the metal films 132Y formed along the side 130Y2 is larger than the thickness of the silicon substrate of the lid 130.

As described above, the plating layer 131 is formed on the lower surface of the lid 130 which is formed of a silicon substrate, and the plating layer 132 is formed on the upper surface of the lid. The lid 130 comes into ohmic contact with the plating layers 131 and 132.

Next, a process of bonding the housing 120 of the hollow housing 110 and the lid 130 in the embodiment will be described with reference to FIGS. 4A and 4B.

Figure 4A:
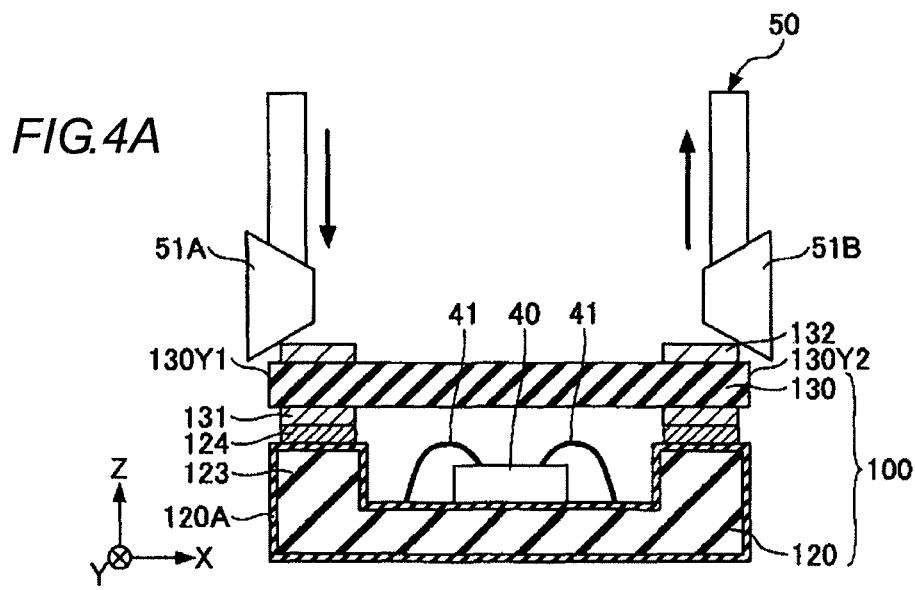
FIGS. 4A and 4B are views showing a process of mounting a lid 130 onto a housing 120 in a manufacturing process of an electronic device 100 of the embodiment.
Figure 4B:
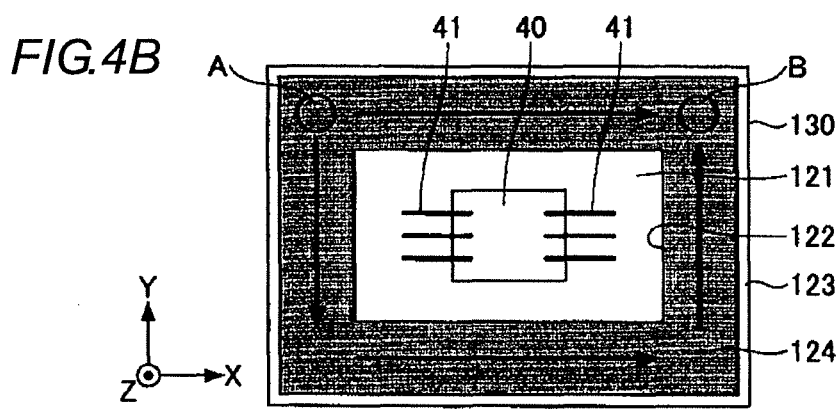

FIGS. 4A and 4B are views showing a process of mounting the lid 130 to the housing 120 in a manufacturing process of an electronic device 100 of the embodiment, FIG. 4A is a cross-sectional view corresponding to the FIG. 3B, and FIG. 4B is a plan view corresponding to FIG. 3E.

As shown in FIG. 4A, the plating layer 124 and the plating layer 131 are melted using the welding machine 50, and the electronic device 100 is manufactured by bonding the upper surface of the wall portion 123 of the housing 120 and the lower surface of the lid 130 through the melted plating layers 124 and 131.

In order to melt the plating layers 124 and 131, as shown in FIG. 4A, the roller electrodes 51A and 51B of the welding machine 50 abut the plating layer 132 which is formed on the upper surface of the lid 130. The roller electrodes 51A and 51B abut a pair of metal films 132Y which are positioned at the most positive direction side in the Y axis direction in the plurality of metal films 132X and 132Y of the plating layer 132.

Here, since the lid 130 is formed of a silicon substrate to which impurities are implanted, currents can flow to the lid.

Thereby, as shown in FIG. 4A, the roller electrodes 51A and 51B abut the metal films 132Y of the side 130Y1 of the lid 130 and the metal film 132Y of the side 130Y2 respectively, and if current flows in the direction from the roller electrode 51A to the roller electrode 51B, the current flows as follows.

That is, the current flows in the thickness direction of the lid 130 via the metal films 132Y of the side 130Y1 from the roller electrode 51A, and reaches the plating layers 131 and 124. At this time, the current reaches a point A of the plating layer 124 shown in FIG. 4B. The point A is positioned below the metal film 132Y positioned the most positive direction side in the Y axis direction in the metal films 132Y of the side 130Y1.

In addition, the current flows in the thickness direction (in Z-axis positive direction) of the lid 130 from the plating layer 131 in a point B via the plating layer 124 having a rectangular annular shape in a plan view as shown in FIG. 4B, reaches the metal films 132Y, and flows to the roller electrode 51B. Moreover, the point B is positioned below the metal film 132Y positioned at the most positive direction side in the Y axis direction in the metal films 132Y of the side 130Y2.

In addition, for convenience of descriptions, a pathway of the current which flows to the plating layer 124 is shown in FIG. 4B. However, since the plating layer 124 and the plating layer 131 contact each other over one round in the rectangular annular shape, when current flows to the plating layer 124, similarly, current also flows to the plating layer 131.

Here, the distance D2 (refer to FIG. 3C) between the pair of metal films 132Y which abut the roller electrodes 51A and 51B is longer than the thickness of the lid 130.

That is, a resistance value of the lid 130 (silicon substrate) between the pair metal films 132Y disposed with the distance D2 in the X axis direction is larger than a resistance value of the lid 130 (silicon substrate) between the metal film 132Y and the plating layer 131 formed on the lower surface of the lid 130 with the thickness of the lid 130.

Thereby, if the roller electrodes 51A and 51B abut the pair of metal films 132Y and current flows to the electrodes, the current does not directly flow between the pair of metal films 132Y in the X axis direction in the inner portion of the lid 130, and the current flows between the metal film 132Y and the plating layer 131 in the Z axis direction.

This is because the resistance value of the lid 130 (silicon substrate) between the metal film 132Y and the plating layer 131 formed on the lower surface of the lid 130 is smaller than the resistance value of the lid 130 (silicon substrate) between the pair of metal films 132Y disposed with the distance D2 in the X axis direction.

Accordingly, if the roller electrodes 51A and 51B abut the pair of metal films 132Y and current flows to the electrodes, the plating layer 131, which is disposed at the rear side (lower surface side) of the lid 130 with respect to the pair of metal films 132Y, is heated. Moreover, since the plating layer 131 abuts the plating layer 124, current also flows in the plating layer 124. Thereby, the plating layer 124 is also heated by resistance heat and melted. In this way, the plating layer 131 and the plating layer 124 can be melted.

Moreover, if the roller electrodes 51A and 51B move to the Y-axis negative direction side in the state where the plating layer 131 and the plating layer 124 are melted, since the portion to which current flows moves to the Y-axis negative direction side, the plating layer 131 and the plating layer 124 are solidified and bonded to each other.

Thereby, if the roller electrodes 51A and 51B move to the Y-axis negative direction side, seam welding can be performed to the plating layer 124 and the plating layer 131 along the sides 130Y1 and 130Y2 of the lid 130.

In addition, if the roller electrodes 51A and 51B abut the pair of metal films 132Y and current flows to the metal film in order to melt the plating layer 131 and the plating layer 124, since the current flows to the lid 130 made of a silicon substrate, the lid 130 is also heated. It is considered that the heating of the lid 130 also contributes to the melting of the plating layers 131 and 124.

Moreover, FIG. 4A shows the state where the seam welding is performed in the Y axis direction by abutting the roller electrodes 51A and 51B to the pair of metal films 132Y and flowing current to the metal films. However, this is also applied in the X axis direction similarly.

The distance D1 (see FIG. 3C) between the pair of metal films 132X is longer than the thickness of the lid 130.

That is, the resistance value of the lid 130 (silicon substrate) between the pair metal films 132X disposed with the distance D1 in the Y axis direction is larger than the resistance value of the lid 130 (silicon substrate) between the metal film 132X and the plating layer 131 formed on the lower surface of the lid 130 with the thickness of the lid 130.

Thereby, if the roller electrodes 51A and 51B abut the pair of metal films 132X and current flows to the electrodes, the current does not directly flow between the pair of metal films 132X in the Y axis direction in the inner portion of the lid 130, and the current flows between the metal film 132X and the plating layer 131 in the Z axis direction.

Accordingly, if the roller electrodes 51A and 51B abut the pair of metal films 132X and current flows to the electrodes, the plating layer 131, which is disposed at the rear side (lower surface side) of the lid 130 with respect to the pair of metal films 132X, is heated, and the plating layer 131 and the plating layer 124 can be effectively melted.

Moreover, if the roller electrodes 51A and 51B move in the X axis direction in the state where the plating layer 131 and the plating layer 124 are melted, since the portion to which current flows moves in the X axis direction, the plating layer 131 and the plating layer 124 are solidified and bonded to each other.

Thereby, if the roller electrodes 51A and 51B move in the X axis direction, seam welding can be performed to the plating layer 124 and the plating layer 131 along the sides 130X1 and 130X2 of the lid 130.

Moreover, since the plating layer 132 which abuts the roller electrodes 51A and 51B has a higher melting point than the plating layer 131, when the seam welding is performed, a current amount or the like may be adjusted to a temperature in which the plating layer 131 is melted but the plating layer 132 is not melted.

Next, transmission paths of current and heat in the hollow housing 110 (see FIGS. 3A to 3E) of the embodiment and the hollow housing 10 (see FIG. 1) of the Comparative Example will be described with reference to FIGS. 5A to 6D.

Figure 5A:
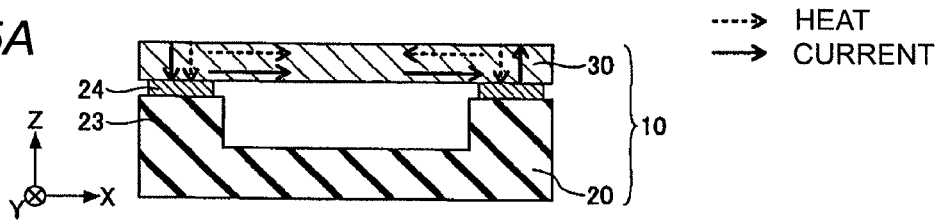
FIGS. 5A to 5C are cross-section views showing transmission paths of current and heat in a hollow housing 110 of the embodiment and hollow housings 10 and 10A of the Comparative Example, respectively.
Figure 5B:
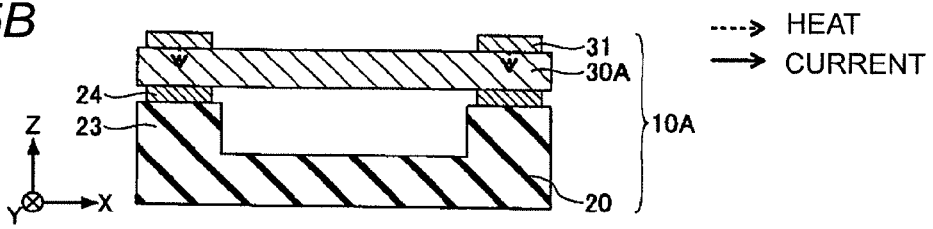
Figure 5C:
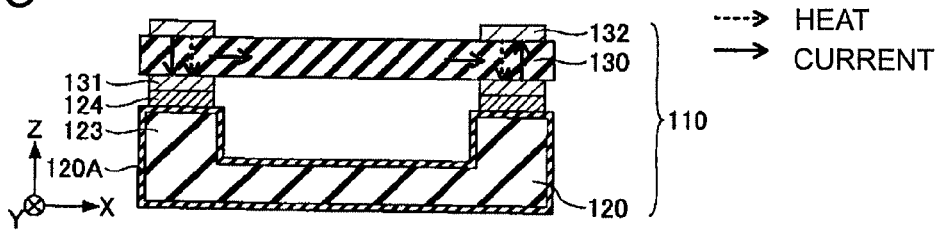

FIGS. 5A to 5C are cross-section views showing transmission paths of current and heat in the hollow housing 110 of the embodiment and the hollow housings 10 and 10A of the Comparative Example. FIGS. 6A to 6D are plan views showing transmission paths of current in the hollow housing 110 of the embodiment and the hollow housings 10 and 10A of the Comparative Example.

FIG. 5A is a view showing transmission paths of current and heat in the hollow housing 10 (see FIGS. 1A to 1C) of the Comparative Example, and FIG. 5B is a view showing transmission paths of current and heat in a hollow housing 10A of the modification of the Comparative Example. FIG. 5C is a view showing transmission paths of current and heat in the hollow housing 110 of the embodiment.

In addition, the welding machine 50 (see FIGS. 2A and 4A) is not shown in FIGS. 5A to 5C. However, in order to perform seam welding by roller electrodes 51A and 51B of the welding machine 50, the roller electrodes 51A and SIB abut the upper side of the lid and current is supplied to the electrodes.

Figure 6A:
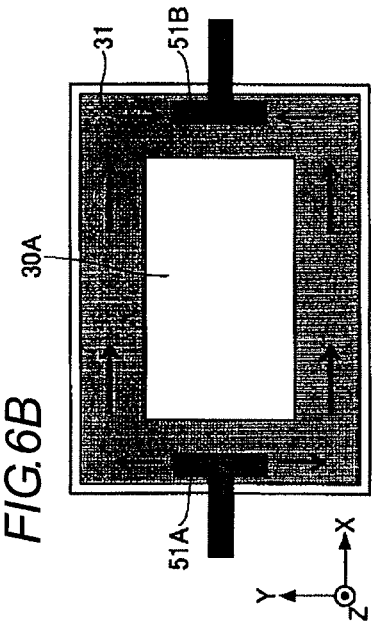
FIGS. 6A to 6D are plan views showing transmission paths of current in the hollow housing 110 of the embodiment and the hollow housings 10 and 10A of the Comparative Example, respectively.
Figure 6C:
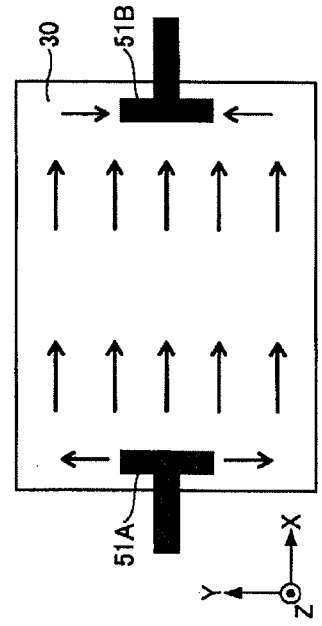
Figure 6B:
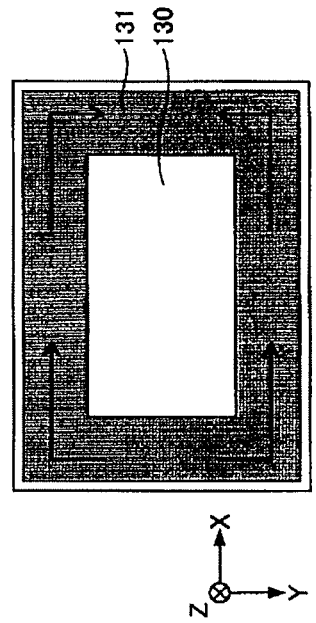
Figure 6D:
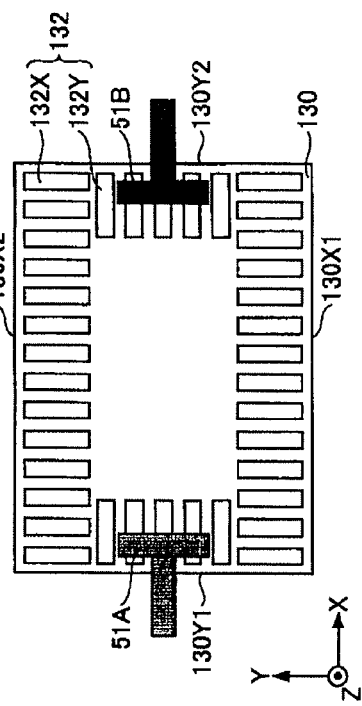

FIG. 6A is a view showing the transmission path of current in the lid 30 of the hollow housing 10 of the Comparative Example shown in FIG. 5A, and FIG. 6B is a view showing the transmission path of current in a lid 30A of the hollow housing 10A of the modification of the Comparative Example shown in FIG. 5B. FIG. 6C is a view showing the transmission path of current on the upper surface of the lid 130 of the hollow housing 110 of the embodiment shown in FIG. 5C, and FIG. 6D is a view showing the transmission path of current on the lower surface of the lid 130 shown in FIG. 6C.

As shown in FIG. 5A, in the hollow housing 10 of the Comparative Example, since the lid 30 is made of Kovar, if current is supplied to roller electrodes (not shown), the current flows to the lid 30 as shown by an arrow of a solid line. At this time, in the inner portion of the lid 30, current flows in the thickness direction (Z-axis negative direction), and current also flows in the transverse direction (X axis direction). This is because the lid 30 is a conductor.

Moreover, at this time, as shown in an arrow of a broken line, similar to the current, heat is transmitted in the thickness direction (Z-axis negative direction), and is also transmitted in the transverse direction (X axis direction). The heat is generated by resistance heat of the lid 30 since current flows to the lid 30 made of Kovar.

Moreover, as shown in FIG. 6A, in a plan view, current flows in the direction from the roller electrode 51A toward the roller electrode 51B in the lid 30.

Accordingly, the plating layer 24 can be melted, and thus, seam welding can be performed to the lid 30 and the housing 20 through the plating layer 24.

In this way, in the hollow housing 10 of the Comparative Example, since the lid 30 made of Kovar has high electrical conductivity and high thermal conductivity, seam welding is possible. However, current and heat are also transmitted to a portion of the lid 30 (center portion of the lid 30) at which the seam welding is not performed. Thereby, usage efficiency of energy is decreased by the diffusion of current and heat.

Moreover, in the hollow housing 10A of the modification of the Comparative Example shown in FIGS. 5B and 6B, the lid 30A made of ceramic is used instead of the lid 30 made of Kovar. The plating layer 31 is formed on a rectangular annular shaped region along four sides on the upper surface of the lid 30A made of ceramic.

As shown in FIG. 6B, if roller electrodes 51A and 51B abut the plating layer 31 of the upper surface of the lid 30A and current flows to the electrodes, as indicated with an arrow of a solid line, the current flows to the plating layer 31 between the roller electrodes 51A and 51B. Since the lid 30A is made of ceramic and is an insulator, as shown in FIGS. 5B and 6B, current does not flow to the lid 30A.

Thereby, even when the roller electrodes 51A and 51B abut the plating layer 31 and current flows to the plating layer as shown in FIG. 6B, as shown in FIG. 5B, heat does not sufficiently reach the plating layer 24 which is the lower surface of the lid 30A, and it is difficult to melt the plating layer 24.

Accordingly, like the hollow housing 10A of the modification of Comparative Example, even when the plating layer 31 is formed on the upper surface of the lid 30A made of ceramic, it is difficult to melt the plating layer 24, and it is difficult to bond the housing 20 and the lid 30A by seam welding. Moreover, large power is consumed, and thus, manufacturing efficiency is deteriorated.

On the other hand, as shown in FIGS. 5C and 6C, in the hollow housing 110 of the embodiment, the plating layer 131 is formed on the lower surface of the lid 130 made of a silicon substrate to which impurities are implanted, and the plating layer 132 is formed on the upper surface of the lid 130. The plating layer 132 includes the plurality of metal films 132X and 132Y (see FIG. 3C).

Thereby, if roller electrodes 51A and 51B abut the plating layer 132 and current flows to the electrodes as shown in FIG. 6C, as shown in FIGS. 5C and 6D, current flows in the thickness direction of the lid 130 from the plating layer 132 as shown in a solid line, and the current reaches the plating layers 131 and 124.

As a result, the plating layers 131 and 124 are melted by resistance heat of the plating layers 131 and 124, and the housing 120 and the lid 130 can be bonded to each other by seam welding.

In the hollow housing 110 of the embodiment, as shown in FIGS. 5C and 6D, current flows in the thickness direction of the lid 130 from the plating layer 132 which includes the plurality of metal films 132X and 132Y, and reaches the plating layer 131.

Since the plating layer 131 has a rectangular annular shape in a plan view, current does not diffuse in the center portion of the lid 130, and current flows along the plating layer 131 having a rectangular annular shape. Moreover, at this time, current also flows to the plating layer 124 which contacts the plating layer 131.

In addition, the plating layer 131 and the plating layer 124 are melted by resistance heat, and the plating layer 131 and the plating layer 124 are integrated with each other. Thereby, the housing 120 and the lid 130 are bonded to each other.

Accordingly, the plating layer 131 is formed on the lower surface of the lid 130 made of a silicon substrate to which impurities are implanted, the plating layer 132 is formed on the upper surface, and thus, current can flow from the plating layer 132 to the plating layer 131 via the lid 130. Thus, the housing 120 and the lid 130 can be bonded to each other by seam welding.

In this way, the lid 130 is formed of a silicon substrate to which impurities are implanted, and current flows to the lid if voltage is applied to the lid.

In addition, the thickness of the lid 130 is set to the length which is shorter than the distances D1 and D2 between the pair of metal films 132X and 132Y of the plating layer 132 formed on the upper surface of the lid 130.

Thereby, if the roller electrodes 51A and 51B abut the pair of metal films 132X and 132Y of the plating layer 132 and current flows to electrodes, current almost does not flow in the plane direction (XY direction) of the lid 130, and the current can selectively flow in the thickness direction (Z direction).

Thereby, diffusion of current to the center portion of the lid 130 can be suppressed, the target place (the plating layer 131 immediately below the pair of metal films 132X and 132Y which abuts the roller electrodes 51A and 51B) of the seam welding can be selectively heated.

Thereby, usage efficiency of energy is improved, and the seam welding can be performed by power which is smaller than the case where the hollow housing 10 of the Comparative Example is bonded by the seam welding.

Moreover, since the lid 130 is made of a silicon substrate, thermal conductivity of the lid 130 is lower than that of the lid 30 made of Kovar of the Comparative Example. Thereby, heat diffusion to the center portion of the lid 130 can be also suppressed.

As described above, in the hollow housing 110 of the embodiment, if the roller electrodes 51A and 51B abut the pair of metal films 132X and current flows to electrodes, the current flows in the thickness direction of the lid 130 which is formed of a silicon substrate to which impurities are implanted. Thereby, when seam welding is performed, current can be prevented from being diffused to the center portion of the lid 130, and consumed power can be decreased.

Moreover, since the lid 130, which is formed of a silicon substrate to which impurities are implanted, is used, heat can be suppressed from being diffused to the center of the lid 130 when seam welding is performed. Also, consumed power can be decreased.

Therefore, according to the embodiment, the hollow housing 110 and the electronic device 100 which are effectively manufactured can be provided.

Moreover, in the hollow housing 110 of the embodiment, it is possible to improve usage efficiency of energy.

In addition, since the hollow housing 110 of the embodiment includes the housing 120 made of a silicon substrate and the lid 30 made of a silicon substrate, it is possible to achieve the miniaturization in a semiconductor manufacturing technology. According to the embodiment, the hollow housing 110 and the electronic device 100 having improved miniaturization can be provided.

Particularly, when the MEMS chip 40 is mounted on the hollow housing 110, since the miniaturization of the MEMS chip 40 is realized and miniaturization of the hollow housing 110 is improved, a significantly small-sized electronic device 100 can be provided. Moreover, the MEMS chip 40 may be integrally formed of the same silicon substrate as the case 120.

Next, specific resistance, current density, and loss of the lid 130 of the embodiment, the lid 30 of the Comparative Example, and the lid 30A of the modification of the Comparative Example will be described with reference to FIG. 7.

FIG. 7 is a view showing specific resistance, current density, and loss of the lid 30 of the Comparative Example, the lid 130 of the embodiment, and the lid 30A of a modification of the Comparative Example. The current density and the loss shown in FIG. 7 are values which are obtained by electromagnetic field simulation.

In FIG. 7, as materials of the lid 30 of the Comparative Example, the lid 130 of the embodiment, and the lid 30A of the modification of the Comparative Example, Kovar (the lid 30), silicon (the lid 130), and alumina (the lid 30A) are shown.

In order to match conditions, the specific resistance, the current density, and the loss of Kovar (the lid 30) and the alumina (the lid 30A) shown in FIG. 7 are simulation values which are obtained by changing the material of the lid 130 of the hollow housing 110 of the embodiment shown in FIGS. 3A to 3E from silicon to Kovar and alumina.

That is, the specific resistance, the current density, and the loss of Kovar (lid 30) and the alumina (the lid 30A) are simulation values which are obtained by changing the material of the lid 130 from silicon to Kovar and alumina in a state where the plating layer 131 and the plating layer 132 are formed on the lower surface and the upper surface of the lid 130 respectively as shown in FIGS. 3A to 3E.

Thereby, in the descriptions of FIG. 7, expressions such as the lid 130 made of Kovar and the lid 130 made of alumina are used in addition the lid 130 made of silicon.

As shown in FIG. 7, the specific resistance of Kovar was 4.9E-5 ($4.9 \times 10^{-5}$) $\Omega \cdot$cm, the specific resistance of silicon was 0.01 $\Omega \cdot$cm, and the specific resistance of alumina was 1E10 ($1.0 \times 10^{10}$)$\Omega \cdot$cm.

Since Kovar is a metal (alloy) and a conductor, the specific resistance is significantly low. Moreover, since the alumina is an insulator, the specific resistance is significantly high. On the other hand, in the silicon to which impurities was implanted, the specific resistance indicated a value closer to Kovar than an intermediate value of the specific resistance of Kovar and alumina.

Moreover, the specific resistance of the plating layer 131 made of nickel coating film was 1E-4 (1.0×10−4) Ω· in all cases of Kovar, silicon, and alumina.

In addition, the current density in Kovar was 5.2E10 (5.2×$10^{10}$) A/m$^2$, and the current density in the silicon was 1.1E11 (1.1×$10^{11}$) A/m$^2$. Moreover, since the alumina is an insulator and current does not flow to the alumina, the value of the current density was not obtained.

In this way, it was shown that the current density of the silicon was higher than that of Kovar. This is because the specific resistance of the silicon is higher than that of Kovar, and thus, diffusion of current is suppressed and the current density is increased.

Moreover, the loss (resistance loss) in Kovar was 2.4E14 (2.4×$10^{14}$) W/m3, and the loss in the plating layer 131 of the lower surface of the lid 130 made of Kovar was 1.5E14 (1.5×$10^{14}$) W/m$^3$.

On the other hand, the loss in the case of silicon was 7.8E14 (7.8×$10^{14}$) W/m$^3$, and the loss in the plating layer 131 of the lower surface of the lid 130 made of silicon was 5.2E14 (5.2×$10^{14}$) W/m$^3$.

That is, it was found that the loss of the lid 130 made of silicon was larger than the loss of the lid 130 made of Kovar. This is because the specific resistance and the current density of the lid 130 made of silicon are larger than those of the lid 130 made of Kovar.

This means that the plating layer 131 is more efficiently heated when the lid 130 made of silicon is used.

That is, as shown in FIG. 7, it can be understood that heating efficiency of the plating layer 131 is higher and seam welding is performed by less power when the seam welding is performed using the lid 130 made of silicon than when the seam welding is performed using the lid 130 made of Kovar.

Next, the distribution of the current density in case of using the lid 130 made of silicon and in case of using the lid 130 made of Kovar will be described with reference to FIGS. 8A and 8B.

Figure 8A:
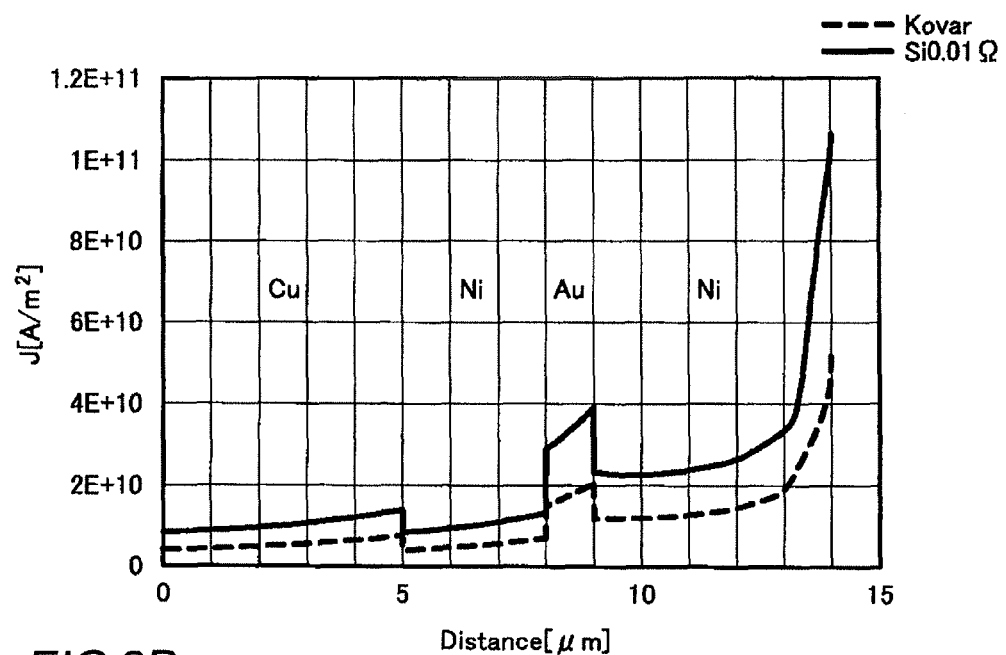
FIGS. 8A and 8B are views showing distribution of current density in the lid 130 made of silicon and the lid 130 made of Kovar, respectively.
Figure 8B:
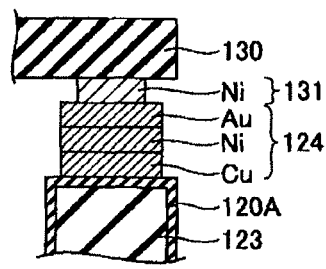

Moreover, similar to FIG. 7, the current density shown in FIGS. 8A and 8B is electromagnetic field simulation results which are obtained when the material of the lid 130 is silicon (the embodiment) and when the material of the lid 130 is Kovar in the structure of the hollow housing 110 of the embodiment. Thereby, in the descriptions of FIGS. 8A and 8B, expression such as the lid 130 made of Kovar is used in addition to the lid 130 made of silicon.

FIGS. 8A and 8B are views showing distribution of current density in case of using the lid 130 made of silicon and in case of using the lid 130 made of Kovar, respectively.

FIG. 8A shows the current density in a copper layer, a nickel layer, and a gold layer of the plating layer 124 and a nickel layer of the plating layer 131.

The copper (Cu) layer, the nickel (Ni) layer, and the gold (Au) layer of the plating layer 124 and the nickel (Ni) layer of the plating layer 131 are provided between the wall portion 123 of the housing 120 and the lid 130 as shown FIG. 8B.

In this way, FIGS. 8A and 8B show simulation results when the plating layer 124 has a three-layer structure. Moreover, FIGS. 8A and 8B show a case where the width of the plating layer 131 is smaller than that of the plating layer 124. This is because the current density can be increased in the plating layer 131 when current flows to the plating layer 131 by narrowing the width of the plating layer 131. If the current density is increased, a heating value in the plating layer 131 can be increased, and thus, the plating layer 131 and the plating layer 124 can be effectively melted.

Cu, Ni, Au, Ni indicated in a horizontal axis direction of FIG. 8A correspond to the copper (Cu) layer, the nickel (Ni) layer, and the gold (Au) layer of the plating layer 124 and the nickel (Ni) layer of the plating layer 131, respectively.

Moreover, in FIG. 8A, a solid line represents the characteristic of the current density in case of using the lid 130 made of a silicon, and a broken line represents the characteristic of the current density in case of using the lid 130 made of Kovar.

As can be seen from FIG. 8A, in case of using the lid 130 made of silicon compared to the case of using the lid 130 made of Kovar, the current density was higher in all areas of the copper (Cu) layer, the nickel (Ni) layer, and the gold (Au) layer of the plating layer 124 and the nickel (Ni) layer of the plating layer 131.

Here, the current density in the nickel (Ni) layer was the lowest of the copper (Cu) layer, the nickel (Ni) layer, and the gold (Au) layer of the plating layer 124. This is because the resistance values of the copper (Cu) layer and the gold (Au) layer are lower than that of the nickel (Ni) layer.

Moreover, the current density of the nickel (Ni) layer of the plating layer 131 was higher than that of the gold (Au) layer of the plating layer 124. This is because the width of the plating layer 131 is smaller than the width of the plating layer 124.

In this way, since the width of the plating layer 131 is smaller than the width of the plating layer 124, the heating value in the plating layer 131 can be increased, and the plating layer 131 and the plating layer 124 can be effectively melted.

As described above, the lid 130 was formed of a silicon substrate to which impurities are implanted, the plating layer 131 was formed on the lower surface of the lid 130, the plating layer 132 was formed on the upper surface of the lid 130. With this configuration, it was understood that the current density in the plating layers 124 and 131 could be increased in seam-welding.

Furthermore, it was understood that heating efficiency of the plating layers 124 and 131 could be increased and the seam welding could be effectively performed by less power.

Finally, a modification of the embodiment will be described with reference FIG. 9.

Figure 9:
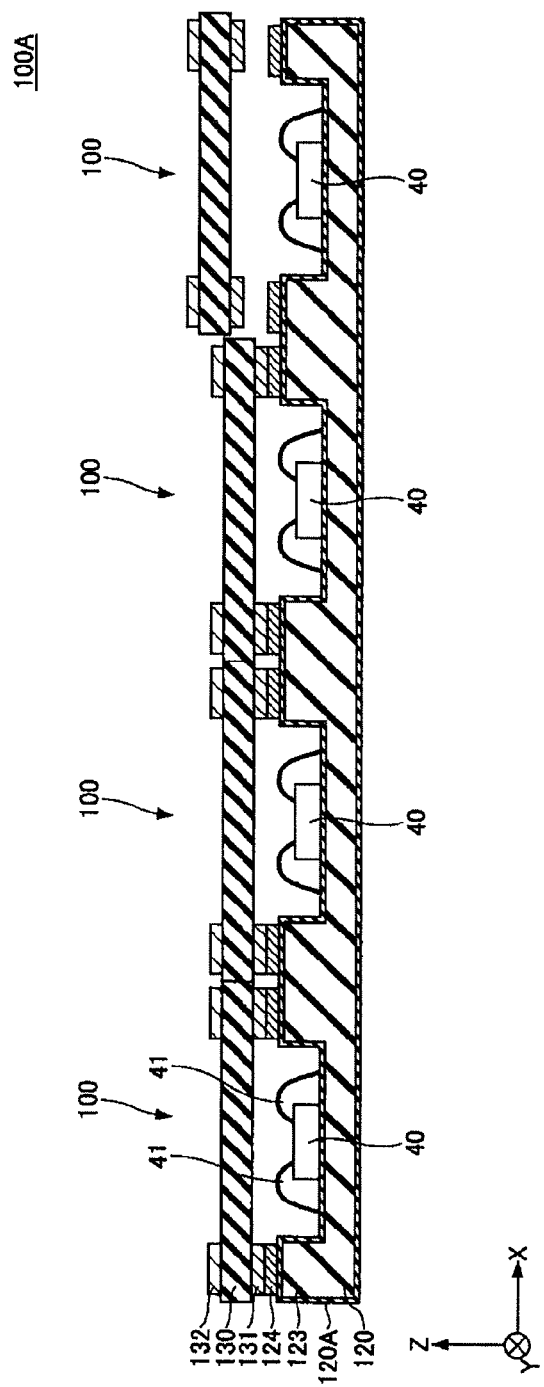
FIG. 9 is a view showing a cross-sectional structure of an electronic device 100A of a modification of the embodiment.

FIG. 9 is a cross-sectional view showing an electronic device 100A of the modification of the embodiment. The cross-section shown in FIG. 9 corresponds to the cross-section shown in FIG. 3B.

In the electronic device 100 (refer to FIGS. 3A to 3E) of the embodiment, since the housing 120 is formed of a silicon substrate, before one housing 120 is formed by dicing a silicon wafer in order to form one electronic device 100, a plurality of housings 120 before dicing may be formed on the silicon wafer.

The electronic device 100A shown in FIG. 9 includes a plurality of electronic devices 100, which are collectively manufactured before dicing. In FIG. 9, the electronic device 100A which includes four electronic devices 100 is shown as an example. However, when the plurality of housings 120 are formed on the silicon wafer before dicing, the electronic device 100A which includes the plurality of electronic devices 100 can be collectively manufactured.

In this way, when the plurality of electronic devices 100 are collectively manufactured, the manufacturing cost can be reduced.

FIG. 9 shows the state where four lids 130 of four electronic devices 100 are separated from each other. However, four lids 130 may be integrally formed with each other, and then the lids 130 may be divided.

As described above, according to the embodiment, since the power required for the seam welding is decreased, power saving can be improved.

Moreover, when the seam welding is performed, since current and heat can be suppressed from being diffused to the center of the lid 130, usage efficiency of energy can be improved.

Moreover, the hollow housing 110 and the electronic device 100 having improved miniaturization can be supplied.

In addition, since the housing 20 is a ceramic substrate and the lid 30 is made of Kovar in the hollow housing 10 of the Comparative Example (see FIGS. 1A to 1C), coefficients of linear expansion of the housing 20 and the lid 30 are largely different from each other. In this way, when the coefficients of linear expansion are largely different from each other, it may be difficult to collectively manufacture the plurality of electronic devices 1 in the heating process such as the seam welding.

Moreover, when a somewhat large electronic device 1 is manufactured, the manufacturing may be difficult due to the difference of coefficients of linear expansion. This is because a shrinkage rate of the lid 30 made of Kovar is larger than that of the housing 20 made of a ceramic substrate when the temperatures of the housing 20 and the lids 30 which are heated for the seam welding are lowered.

On the other hand, in the hollow housing 110 (see FIGS. 3A to 3E) of the embodiment, since the housing 120 and the lid 130 are all made of a silicon substrate, defects due to the coefficient of linear expansion do not easily occur, and the plurality of hollow housings 110 or electronic devices 100 can be collectively manufactured. In addition, an increase in the size of the hollow housing 110 or the electronic device 100 is possible.

Moreover, in the above, the shape is described in which the plating layer 132 is formed in a rectangular annular shape on the upper surface of the lid 130 in a plan view. However, in a case where current flows to the thickness direction of the lid 130 at the time of the seam welding and diffusion of current and heat to the center portion of the lid 130 does not cause any problem, the plating layer 132 may be formed on one surface of the upper surface of the lid 130. In this case, the plating layer 132 may be separated into the plurality of metal films 132X and 132Y or may not be separated.

Moreover, each shape of the metal films 132X and 132Y shown in FIG. 3C is an example, and other shapes may be adopted. In addition, the disposition pattern of the metal films 132X and 132Y shown in FIG. 3C is an example, and the metal films may be disposed in other patterns.

Moreover, in the above, the shape is described in which the distance D1 between the pair of metal films 132X and the distance D2 between the pair of metal films 132Y are larger than the thickness of the lid 130. However, in addition to the condition, the intervals of the metal films 132X and 132Y adjacent to each other in a plan view may be wider than the thickness of the lid 130. In this case, flowing of current to adjacent metal films 132X and 132Y is difficult, and thus, the current density is increased, and efficiency of the seam welding is further improved.

Moreover, in the above description, the housing 120 and the lid 130 are made of a silicon substrate. However, the housing 120 and the lid 130 may be semiconductor substrates which are formed by materials other than silicon.

In addition, the housing 120 may not be a semiconductor substrate. For example, the housing 120 may be manufactured using a substrate made of ceramic such as alumina. If the housing 120 is made of ceramic and the lid 130 is made of a semiconductor substrate, problems of the coefficient of linear expansion do not occur.

While the preferred embodiments and their modifications and examples have been described now, the present invention is not limited to the preferred embodiments and their modifications and examples described above, and the preferred embodiments and their modifications and examples may be modified and replaced in various ways without deviating from the scope defined in the appended claims.

What is claimed is:
1. An electronic device comprising:
   a housing comprising a first surface and a second surface opposite to the first surface, wherein a concave portion is formed in the first surface of the housing;
   a lid made of a semiconductor material containing an impurity material and comprising a first surface and a second surface opposite to the first surface, wherein the first surface of the lid faces the first surface of the housing;
   a first metal film formed in a metal film formation region on the first surface of the housing, wherein the metal film formation region is defined as a region surrounding the concave portion on the first surface of the housing;
   a second metal film formed on the first surface of the lid to overlap with the metal film formation region in a plan view of the electronic device, the second metal film having a rectangular annular shape in the plan view;
   a third metal film formed on the second surface of the lid to overlap with the metal film formation region in the plan view; and
   an electronic component disposed in the concave portion,
   wherein the lid is bonded onto the housing via the first and second metal films to cover the electronic component disposed in the concave portion,
   wherein the third metal film comprises a plurality of metal film portions which are arranged to be separated from each other in the plan view.
2. The electronic device according to claim 1, wherein intervals between the respective metal film portions are larger than a thickness of the lid.
3. The electronic device according to claim 2, wherein an interval between the metal film portions adjacent to each other is larger than the thickness of the lid.
4. The electronic device according to claim 1, wherein the concave portion is formed in a rectangular shape in the plan view, and
   the first metal film, the second metal film and the third metal film are formed in a frame shape in the plan view.
5. The electronic device according to claim 4, wherein a width of the second metal film is smaller than that of the first metal film in a cross-sectional view of the electronic device.
6. The electronic device according to claim 1, wherein the housing is made of the same semiconductor material as the lid.
7. The electronic device according to claim 1, wherein the semiconductor material is silicon.
8. The electronic device according to claim 1, further comprising:
   an insulating layer entirely covering an outer surface of the housing.

* * * * *